United States Patent
Chang

(10) Patent No.: US 8,626,999 B2
(45) Date of Patent: Jan. 7, 2014

(54) DYNAMIC RANDOM ACCESS MEMORY UNIT AND DATA REFRESHING METHOD THEREOF

(75) Inventor: Kuen-Huei Chang, Taipei (TW)

(73) Assignee: Winbond Electronics Corp., Taichung (TW)

(*) Notice: Subject to any disclaimer, the term of this patent is extended or adjusted under 35 U.S.C. 154(b) by 543 days.

(21) Appl. No.: 12/900,498

(22) Filed: Oct. 8, 2010

(65) Prior Publication Data

US 2012/0089773 A1 Apr. 12, 2012

(51) Int. Cl.
*G06F 13/00* (2006.01)
*G11C 7/00* (2006.01)

(52) U.S. Cl.
USPC .......................................... 711/106; 365/222

(58) Field of Classification Search
USPC ......... 711/105, 106, 109, 119; 365/194, 195, 365/222, 227, 228, 230.03, 230.06
See application file for complete search history.

(56) References Cited

U.S. PATENT DOCUMENTS

| | | | |
|---|---|---|---|
| 5,329,490 A * | 7/1994 | Murotani | 365/222 |
| 6,590,822 B2 | 7/2003 | Hwang et al. | |
| 7,342,841 B2 * | 3/2008 | Jain et al. | 365/222 |
| 7,359,269 B2 * | 4/2008 | You | 365/222 |
| 7,916,569 B2 * | 3/2011 | Kim et al. | 365/222 |

* cited by examiner

*Primary Examiner* — Tuan Thai
*Assistant Examiner* — Zhuo Li
(74) *Attorney, Agent, or Firm* — Jianq Chyun IP Office

(57) ABSTRACT

A dynamic random access memory (DRAM) unit and a data refreshing method thereof are provided. The DRAM unit includes a memory array, a refresh address module, and a refresh control module. The memory array includes multiple memory cells. The refresh address module produces a refresh word line address cyclically during a refresh mode. The refresh control module coupled to the memory array and the refresh address module obtains a start word line address and a stop word line address corresponding to the start word line address to form a memory word line address interval. Then, the refresh control module determines that the refresh word line address is within the memory word line address interval to execute a data charging operation to the memory cells corresponding to the refresh word line address, or stop the data charging operation otherwise, so as to reduce power consumption during the refresh mode.

10 Claims, 7 Drawing Sheets

DYNAMIC RANDOM ACCESS MEMORY UNIT AND DATA REFRESHING METHOD THEREOF

BACKGROUND

1. Field of the Invention

The invention relates to a semiconductor memory device technique of a dynamic random access memory (DRAM). More particularly, the invention relates to a semiconductor memory device technique of performing a refresh operation to memory cells of specified word line address intervals, so as to reduce power consumption.

2. Description of Related Art

In a dynamic random access memory (DRAM), an amount of charges stored in a capacitor is used to represent "1" or "0" of a binary bit, so that each memory cell of the DRAM only requires one capacitor and one switch (or one transistor).

During an actual operation, the capacitors in the DRAM may have an electric leakage phenomenon, which may cause an insufficient potential difference of the capacitors, so that data stored in the DRAM can be disappeared. Therefore, the DRAM has to enter a refresh mode to periodically refresh (which can also be referred to as data charging/data refreshing) all of the memory cells, so as to ensure correctness of information stored in the DRAM. As shown in FIG. 1 and FIG. 2, FIG. 1 is a block diagram illustrating a conventional DRAM unit 10, and FIG. 2 is a signal waveform diagram of a data refreshing method of the conventional DRAM unit 10. Referring to FIG. 1, the DRAM unit 10 includes a memory array 110, a refresh timing controller 120 and a word line address counter 130. The memory array 110 includes a plurality of word lines and a plurality of bit lines. The word lines are perpendicularly intersected to the bit lines, and each intersection thereof has a memory cell for storing a binary (i.e. "0" or "1") bit information.

The refresh timing controller 120 receives an entry refresh signal $S_{ref}$, so as to determine whether the DRAM unit 10 is in the refresh mode. During the refresh mode, the refresh timing controller 120 generates a refresh clock signal $S_{clk}$ (referring to FIG. 2), and the word line address counter 130 cyclically calculates a word line address WL according to the refresh clock signal $S_{clk}$. In the present embodiment, each pulse interval of the refresh clock signal $S_{clk}$ is 8 µS, so as to avoid excessive long refresh period that causes an error of data stored in the memory array 110. Moreover, the word line address WL of the memory array 110 is composed of hexadecimal number of three digits, and a word line addresses interval of the memory array 110 is between $000_H$ and $FFF_H$, so that after the word line address counter 130 sequentially counts from $000_H$ to $FFF_H$, the word line address counter 130 restarts the counting from $000_H$. The memory array 110 continually receives the refresh clock signal $S_{clk}$ and the word line address WL during the refresh mode, so as to periodically refresh all of the memory cells in the memory array 110. However, during an application of the DRAM, not all of the memory cells are stored with data, so that when the memory cells that are not stored with data are charged/refreshed, extra charges are consumed.

Therefore, multiple DRAM refreshing techniques are developed to reduce the power consumption of the DRAM in the refresh mode. U.S. Pat. No. 6,590,822 discloses a self-refresh memory device, and in such memory device, a refresh command signal generated by a computer system is used to mask one or a plurality of bits in a word line address data, and a part of (for example, ½, ¼, ⅛ or 1/16, etc.) RAM memory blocks are provided in advance for data storage and the refresh operation, and other memory blocks are disabled, so as to reduce the power consumption. However, only a fixed rate (for example, ½, ¼ or ⅛, etc.) of the memory capacity of the above memory device can be used to store data. In case of an excessively large memory capacity, extra power is consumed for the memory blocks that are not stored with data during the data refreshing operation, and in case of an excessively small memory capacity, the memory device is not applicable for the computer system. Regarding the above memory device, the computer system cannot specify the required memory capacity in detail, so that a degree of freedom of the DRAM used by the computer system is reduced.

SUMMARY OF THE INVENTION

Accordingly, the invention is directed to a dynamic random access memory (DRAM) unit, which can refresh memory cells corresponding to specified word line address intervals, and stop refreshing memory cells outside the specified word line address intervals during a refresh mode, so as to reduce power consumption during the refresh mode.

According to another aspect, the invention is directed to a data refreshing method of a dynamic random access memory (DRAM) unit, by which memory cells corresponding to specified word line address intervals are refreshed, and memory cells outside the specified word line address intervals are not refreshed during a refresh mode, so as to reduce power consumption during the refresh mode.

The invention provides a dynamic random access memory (DRAM) unit including a memory array, a refresh address module, and a refresh control module. The memory array includes a plurality of memory cells. The refresh address module produces a refresh word line address cyclically during a refresh mode. The refresh control module is coupled to the memory array and the refresh address module, and obtains at least one start word line address and at least one stop word line address corresponding to the start word line address, wherein the start word line addresses and the corresponding stop word line addresses form at least one memory word line address interval. The refresh control module determines whether the refresh word line address is within the memory word line address intervals, and executes a data charging operation to the memory cells corresponding to the refresh word line address if the refresh word line address is within the memory word line address intervals, or stop the data charging operation otherwise.

According to another aspect, the invention provides a data refreshing method of a dynamic random access memory (DRAM) unit, wherein the DRAM unit includes a memory array having a plurality of memory cells. The data refreshing method of the DRAM unit includes following steps. At least one start word line address and at least one stop word line address corresponding to the start word line address are obtained, wherein the start word line addresses and the corresponding stop word line addresses form at least one memory word line address interval. Moreover, a refresh address module is provided during a refresh mode, and the refresh address module produces a refresh word line address cyclically. Then, it is determined that the refresh word line address is within the memory word line address intervals, so as to execute a data charging operation to the memory cells corresponding to the refresh word line address, or stop the data charging operation otherwise.

According to the above descriptions, in the invention, commands of a computer system or self-detect result of the memory cell stored with data form the DRAM can be used to obtain the word line address intervals. Then, during the refresh mode, the refresh control module determines whether the refresh word line address is within the memory word line address intervals, so as to refresh the memory cells within the memory word line address intervals, or stop refreshing the memory cells outside the memory word line address intervals, so that power consumption of the DRAM during the refresh mode can be reduced. Moreover, by determining whether the memory cells in the DRAM have been stored with data, a plurality of the word line address intervals can be obtained, thus a purpose of only refreshing the memory cells stored with data can be achieved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
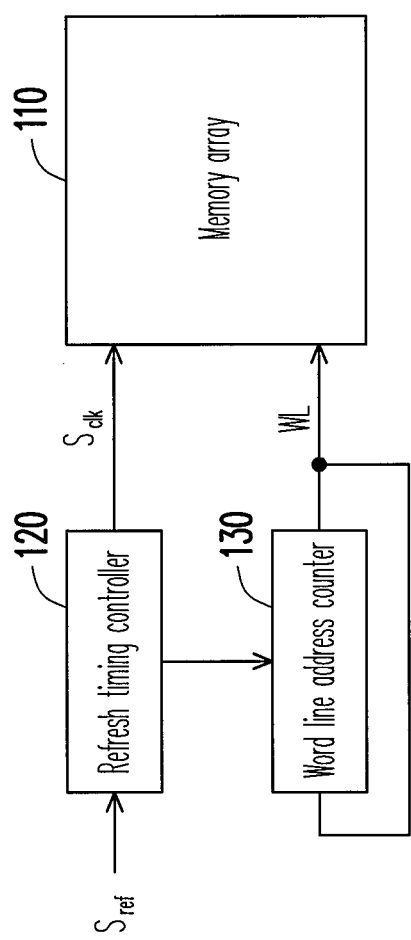
FIG. 1 is a block diagram illustrating a conventional dynamic random access memory (DRAM) unit.
Figure 2:
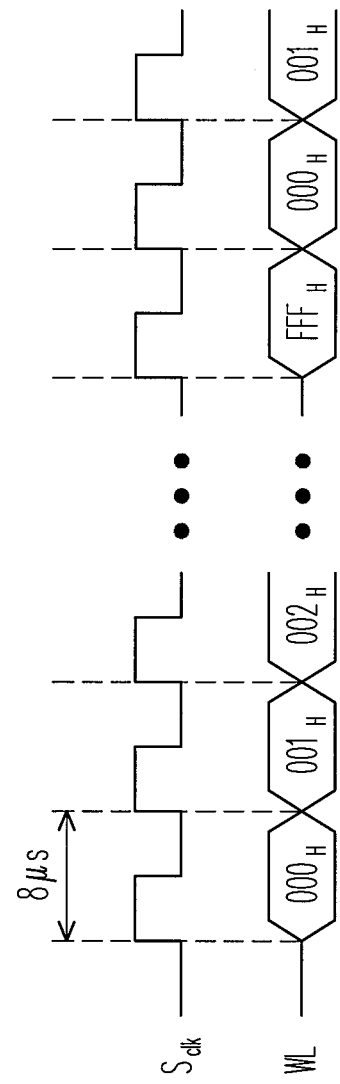
FIG. 2 is a signal waveform diagram of a data refreshing method of a conventional DRAM unit.
Figure 3:
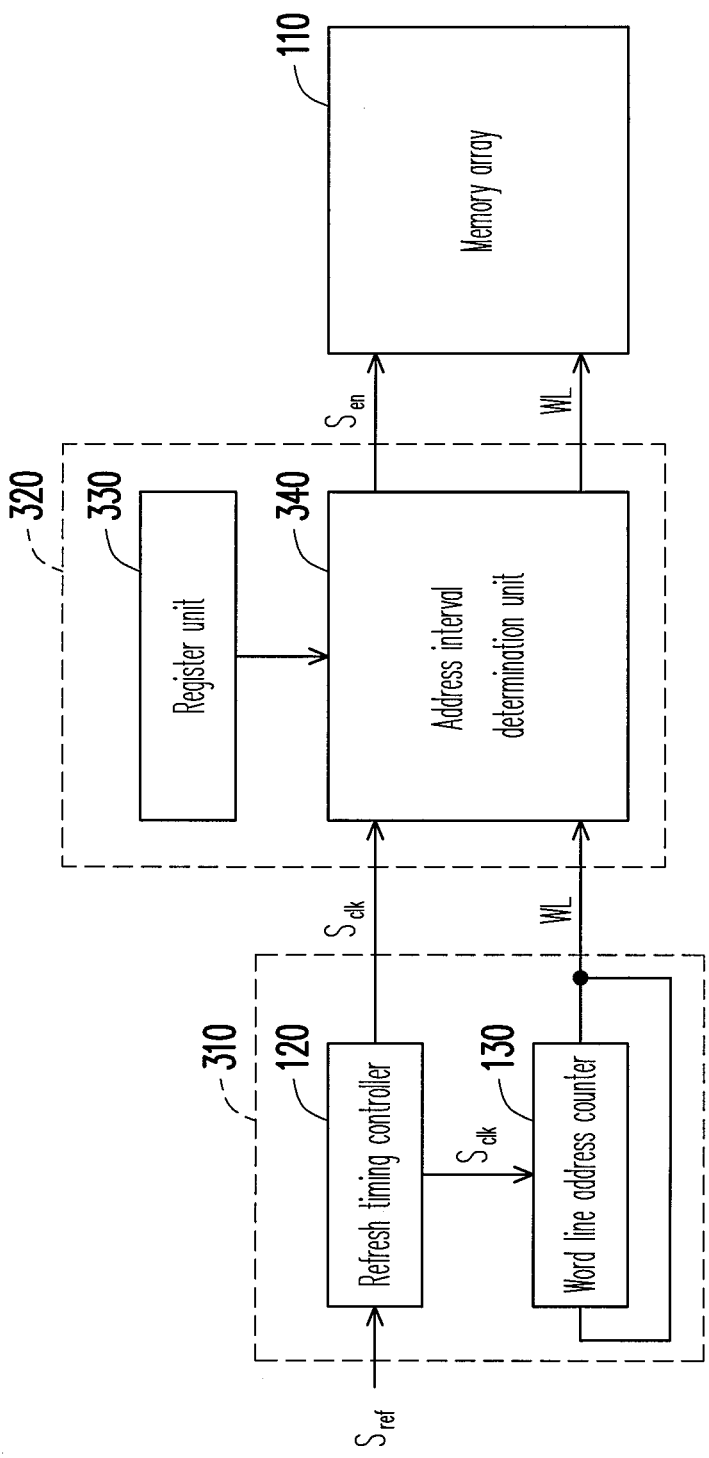
FIG. 3 is a block diagram illustrating a DRAM unit according to an embodiment of the invention.
Figure 4:
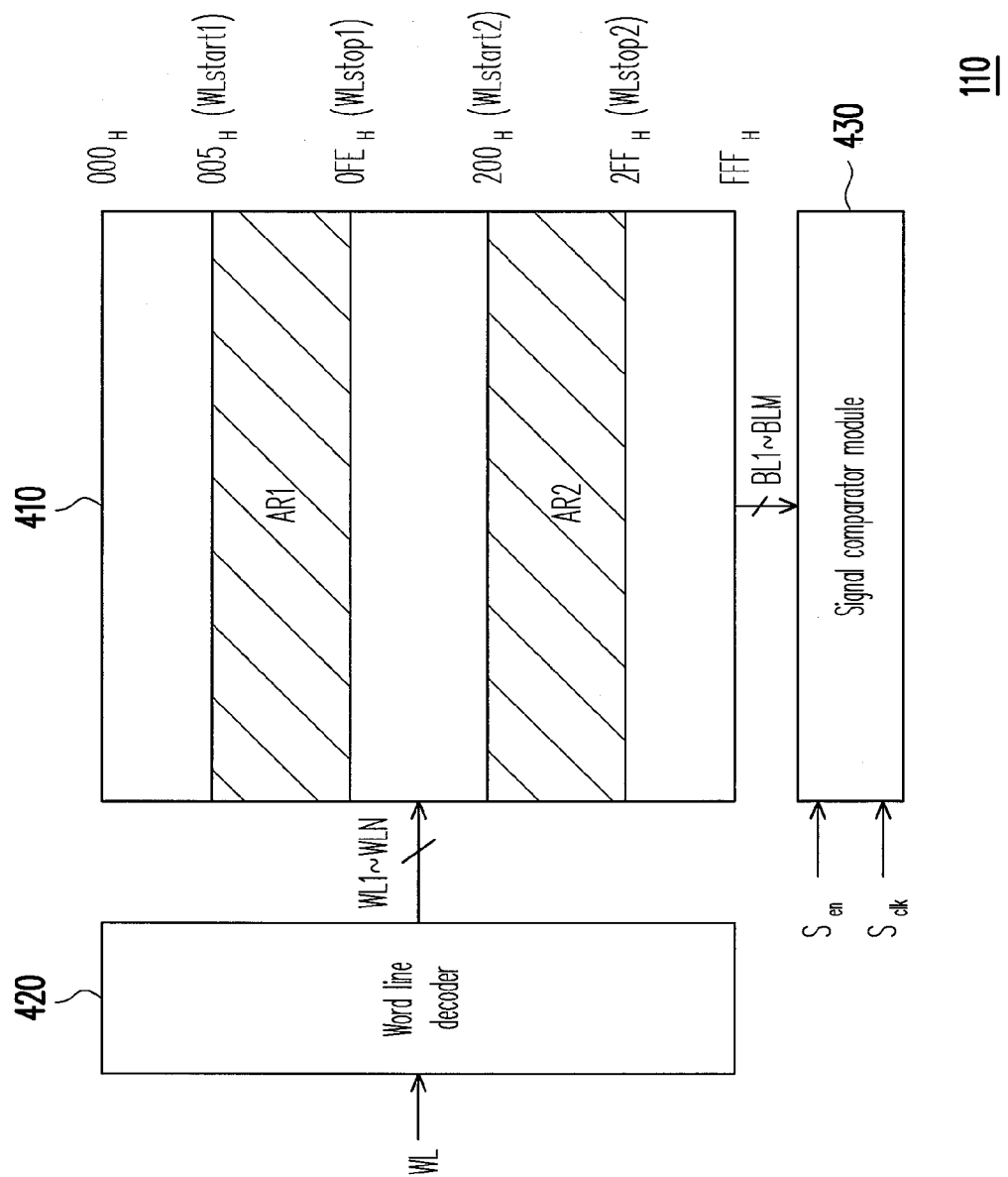
FIG. 4 is a block diagram illustrating a memory array according to an embodiment of the invention.

Referring to FIG. 3, FIG. 3 is a block diagram illustrating a dynamic random access memory (DRAM) unit 30 according to an embodiment of the invention. The DRAM unit 30 includes a memory array 110, a refresh address module 310, and a refresh control module 320. The memory array 110 has a plurality of memory cells, and a structure thereof is as that shown in FIG. 4. FIG. 4 is a block diagram illustrating the memory array 110 according to an embodiment of the invention.

Referring to FIG. 4, the memory array 110 includes a memory block 410, a word line decoder 420 and a signal comparator module 430. The memory block 410 includes word lines WL1-WLN and bit lines BL1-BLM, wherein N is a total number of the word lines WL1-WLN, and M is a number of memory cells corresponding to each of the word lines WL1-WLN. The word lines WL1-WLN are perpendicularly intersected to the bit lines BL1-BLM, and each intersection has a memory cell (not shown), which is used for storing a binary (i.e. "0" or "1") bit information. The memory array 110 can select M-bit data according to one of the word lines WL1-WLN to perform a write/read/refresh operation. The word line decoder 420 receives and decodes a word line address WL to obtain one of the word lines WL1-WLN corresponding to the word line address WL. The signal comparator module 430 receives a refresh clock signal $S_{clk}$ and a clock enable signal $S_{en}$ during the refresh mode, so as to perform a comparison operation of stored data and a data charging operation to the M memory cells corresponding to the word line address WL.

Referring to FIG. 3 again, the refresh address module 310 receives an entry refresh signal $S_{ref}$, so as to determine whether a computer system switches the DRAM unit 30 to the refresh mode, and the refresh address module 310 cyclically produces a refresh word line address WL during the refresh mode. In detail, the refresh address module 310 includes a refresh timing controller 120 and a word line address counter 130. The refresh timing controller 120 generates the refresh clock signal $S_{clk}$ during the refresh mode. The word line address counter 130 is coupled to the refresh timing controller 120, and receives the refresh clock signal $S_{clk}$, so as to cyclically accumulate the word line address WL (which is also referred to as the refresh word line address WL in the present embodiment) according to the refresh clock signal $S_{clk}$. In other words, the so-called "cyclically produce" refers to that the word line address counter 130 accumulates the refresh word line address WL by 1 according to each pulse of each refresh clock signal $S_{clk}$, and when it is accumulated to a last word line address of the memory array 110, the accumulation is restarted from a first word line address of the memory array 110, so as to periodically perform data refreshing to the memory cells stored with data in the memory array 110.

The refresh control module 320 of FIG. 3 is coupled to the memory array 110 and the refresh address module 310. In the present embodiment, the refresh control module 320 includes a register unit 330 and an address interval determination unit 340. The register unit 330 is used for storing start word line addresses WLstart1-WLstartP and stop word line addresses WLstop1-WLstopP. The start word line addresses WLstart1-WLstartP and the corresponding stop word line addresses WLstop1-WLstopP may form P memory word line address intervals, where P is a positive integer, and the memory word line address intervals are not mutually overlapped.

In the present embodiment, the address interval determination unit 340 of FIG. 3 is coupled to the register unit 330, and the address interval determination unit 340 is used for determining whether the refresh word line address WL is within memory word line address intervals AR1 and AR2. If the refresh word line address WL is within the memory word line address intervals AR1 and AR2, the address interval determination unit 340 transmits the refresh word line address WL and the refresh enable signal $S_{en}$ to the memory array 110, so as to perform the data charging operation to the memory cells corresponding to the refresh word line address WL. Moreover, to reduce a circuit area of the DRAM unit 30, the address interval determination unit 340 of the present embodiment is implemented by a digital logic circuit, though the invention is not limited thereto.

Figure 5:
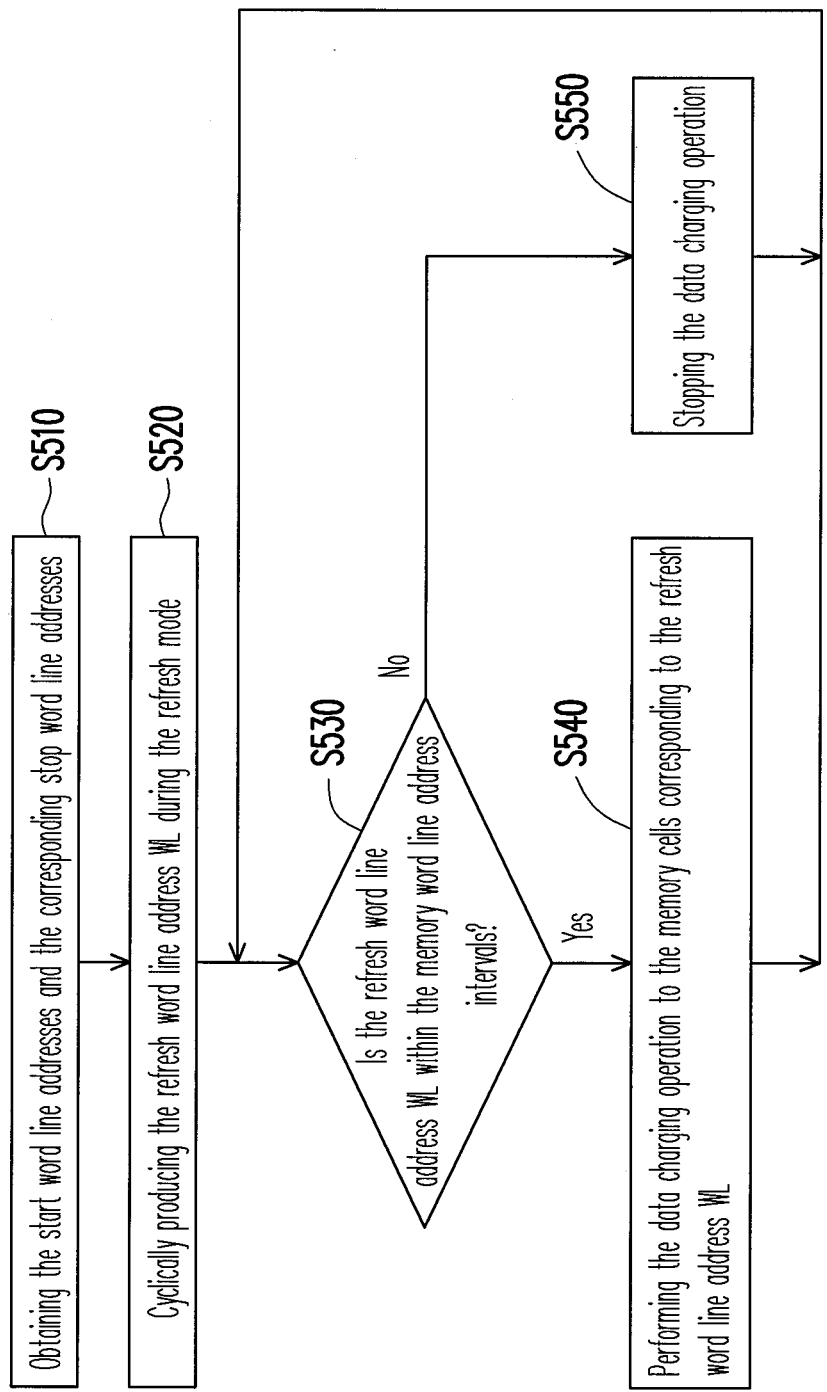
FIG. 5 is a flowchart of a data refreshing method of a DRAM unit according to an embodiment of the invention.
Figure 6:
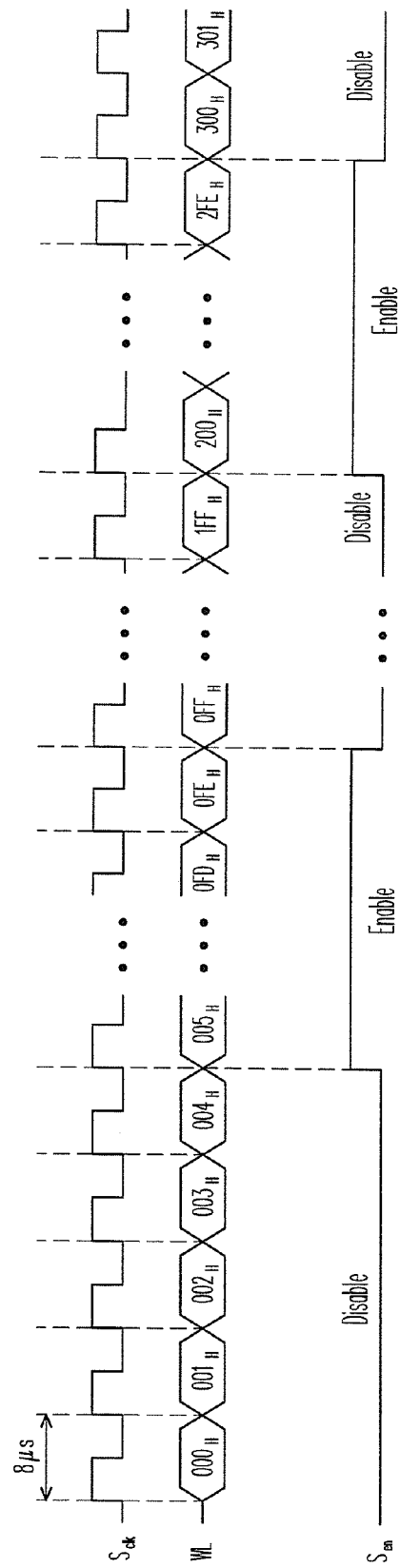
FIG. 6 is a signal waveform diagram of a data refreshing method of a DRAM unit according to an embodiment of the invention.

To fully convey the spirit of the invention to those skilled in the art, a data refreshing method of the DRAM unit 30 is described below with reference of FIG. 5 and FIG. 6. FIG. 5 is a flowchart of a data refreshing method of the DRAM unit 30 according to an embodiment of the invention, and FIG. 6 is a signal waveform diagram of the data refreshing method of the DRAM unit 30 according to an embodiment of the invention. Referring to FIG. 5, in step S510, the DRAM unit 30 first obtains the start word line addresses WLstart1-WLstartP and the corresponding stop word line addresses WLstop1-WLstopP, so as to form the memory word line address intervals AR1 and AR2. It is assumed that the computer system provides two memory word line address intervals AR1 and AR2 (i.e. P=2, which are illustrated on the memory block 410 of FIG. 4) to the refresh control module 320 of the DRAM unit 30 in advance. The first memory word line address interval AR1 is from the address WLstart1 ($005_H$) to the address WLstop1 ($1FE_H$), and the second memory word line address interval AR2 is from the address WLstart2 ($200_H$) to the address WLstop2 ($2FF_H$), wherein a number of the memory word line address intervals provided by the DRAM unit 30 for storage and comparison is determined by a capacity of the register unit.

Moreover, in the step S510, the obtained start word line addresses WLstart1-WLstartP and the corresponding stop word line addresses WLstop1-WLstopP can be preset by a special command of the computer system. In other words, the computer system may preset the required memory capacity, so that the computer system may only use the memory word line address intervals AR1 and AR2 to access data. Alternatively, in other embodiments, the DRAM unit 30 may self-detect the memory cells in the memory array 110 that have been stored with data, and store the start word line addresses and the stop word line addresses of the memory word line address intervals AR1 and AR2 to the register unit 330, so as to achieve a purpose of refreshing the memory cells stored with data.

Referring to FIG. 5 again, when the refresh mode is entered, a step S520 is executed, by which the refresh address module 310 cyclically produces the refresh word line address WL (as that shown in FIG. 6). Then, in step S530, the address interval determination unit 340 receives and determines whether the refresh word line address WL is within the memory word line address intervals AR1 and AR2. If the refresh word line address WL is within the memory word line address intervals AR1 and AR2 (for example, the refresh word line address WL is between $005_H$-$0FE_H$ or $200_H$-$2FF_H$), a step S540 is executed, by which the address interval determination unit 340 switches the refresh enable signal $S_{en}$ to an enable potential (for example, a high potential), so that the signal comparator module 430 (shown in FIG. 4) in the memory array 110 can perform the data charging operation to the memory cells corresponding to the refresh word line address WL.

Comparatively, if the refresh word line address WL is not within the memory word line address intervals AR1 and AR2 (for example, the refresh word line address WL is between $000_H$-$004_H$, $0FF_H$-$1FF_H$ or $300_H$-$FFF_H$), a step S550 is executed, by which the address interval determination unit 340 switches the refresh enable signal $S_{en}$ to a disable potential (for example, a low potential), so that the signal comparator module 430 stops the data charging operation. Moreover, after the steps S540 and S550 are completed, the step S530 is repeated to continually determine whether the refresh word line address WL is within the memory word line address intervals AR1 and AR2.

Figure 7:
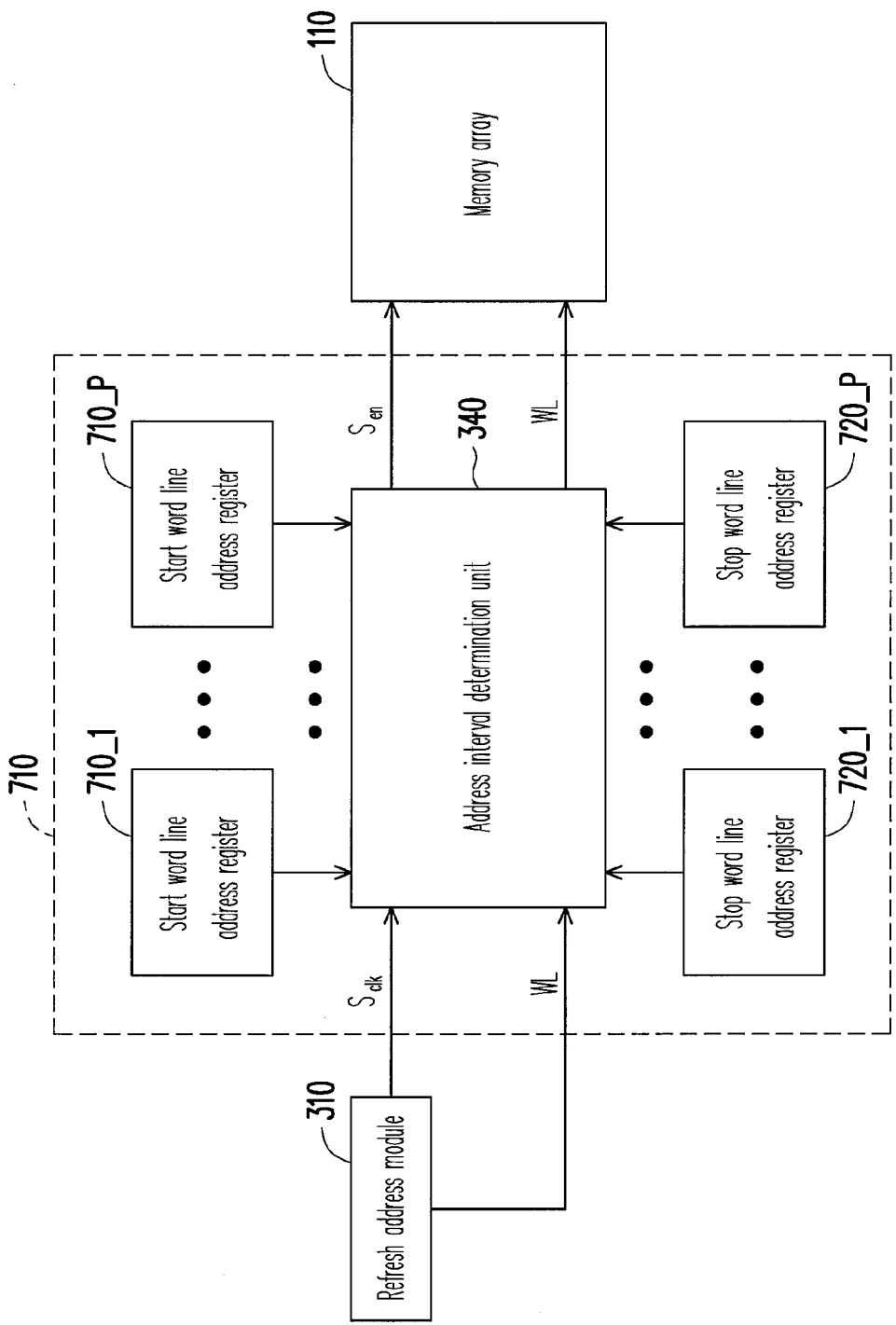
FIG. 7 is a block diagram illustrating a DRAM unit according to another embodiment of the invention.

Another embodiment of the invention is provided below with reference of FIG. 7. FIG. 7 is a block diagram illustrating a DRAM unit according to another embodiment of the invention. Referring to FIG. 7, a difference between the present embodiment and the above embodiment is that in the present embodiment, the register unit can be replaced by a plurality of start word line address registers 710_1-710_P and a plurality of stop word line address registers 720_1-720_P. Each start word line address register 710_$i$ may store one start word line address WLstarti, and the corresponding stop word line address register 720_$i$ stores one stop word line address WLstopi, wherein i is a positive integer, and 1≤i≤P. Other details of the present embodiment are similar to that of the aforementioned embodiment, and therefore detailed descriptions thereof are not repeated.

In summary, in the invention, commands of a computer system or self-detect result of the memory cell stored with data form the DRAM can be used to obtain the word line address intervals. Then, during the refresh mode, the refresh control module determines whether the refresh word line address is within the memory word line address intervals, so as to refresh the memory cells within the memory word line address intervals, or stop refreshing the memory cells outside the memory word line address intervals, so that power consumption of the DRAM during the refresh mode can be reduced. Moreover, by determining whether the memory cells in the DRAM have been stored with data, a plurality of the word line address intervals can be obtained, thus a purpose of only refreshing the memory cells stored with data can be achieved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A dynamic random access memory (DRAM) unit, comprising:
a memory array, comprising a plurality of memory cells;
a refresh address module, for producing a refresh word line address cyclically during a refresh mode; and
a refresh control module, coupled to the memory array and the refresh address module, for obtaining at least one start word line address and at least one stop word line address corresponding to the start word line address,
wherein the start word line addresses and the corresponding stop word line addresses form at least one memory word line address interval, and the refresh control module determines that the refresh word line address is within the memory word line address interval, when the refresh word line address is within the memory word line address intervals, the refresh word line address and a refresh enable signal are transmitted to the memory array, so as to execute a data charging operation to the memory cells corresponding to the refresh word line address, or stop the data charging operation otherwise.

2. The dynamic random access memory unit as claimed in claim 1, wherein the refresh address module comprises:
a refresh timing controller, for producing a refresh clock signal during the refresh mode; and
an address counter, coupled to the refresh timing controller, for receiving the refresh clock signal, and cyclically accumulating the refresh word line address according to the refresh clock signal.

3. The dynamic random access memory unit as claimed in claim 1, wherein the refresh control module comprises:
a register unit, for storing the start word line addresses and the stop word line addresses; and
an address interval determination unit, coupled to the register unit, for determining the memory word line address intervals according to the start word line addresses and the stop word line addresses, and determining whether the refresh word line address is within the memory word line address intervals.

4. The dynamic random access memory unit as claimed in claim 3, wherein the register unit comprises:
a plurality of start word line address registers, and each start word line address register storing one of the start word line addresses; and a plurality of stop word line address registers, and each stop word line address register storing one of the stop word line addresses, wherein each start word line addresses and each corresponding stop word line addresses form one of the memory word line address intervals.

5. The dynamic random access memory unit as claimed in claim 1, wherein the memory word line address intervals are preset by a computer system, the computer system comprises the dynamic random access memory unit, and the memory word line address intervals are formed by the start word line addresses and the corresponding stop word line addresses.

6. The dynamic random access memory unit as claimed in claim 1, wherein the dynamic random access memory unit automatically detects the memory cells stored with data, so as to obtain and store the start word line addresses and the stop word line addresses to the refresh control module.

7. A data refreshing method of a dynamic random access memory (DRAM) unit, wherein the dynamic random access memory unit comprises a memory array having a plurality of memory cells, the data refreshing method of the dynamic random access memory unit comprising:
   obtaining at least one start word line address and at least one stop word line address corresponding to the start word line address, wherein the start word line addresses and the corresponding stop word line addresses form at least one memory word line address interval;
   providing a refresh address module during a refresh mode, and the refresh address module cyclically producing a refresh word line address; and
   determining that the refresh word line address is within the memory word line address intervals, when the refresh word line address is within the memory word line address intervals, the refresh word line address and a refresh enable signal are transmitted to the memory array, so as to execute a data charging operation to the memory cells corresponding to the refresh word line address, or stop the data charging operation otherwise.

8. The data refreshing method of the dynamic random access memory unit as claimed in claim 7, wherein the step of cyclically producing the refresh word line address comprises:
   producing a refresh clock signal during the refresh mode; and
   cyclically accumulating the refresh word line address according to the refresh clock signal.

9. The data refreshing method of the dynamic random access memory unit as claimed in claim 7, wherein the step of obtaining the start word line addresses and the corresponding stop word line addresses comprises:
   providing a computer system, and the computer system presetting the memory word line address intervals, wherein the computer system comprises the dynamic random access memory unit, and the memory word line address intervals are formed by the start word line addresses and the corresponding stop word line addresses.

10. The data refreshing method of the dynamic random access memory unit as claimed in claim 7, wherein the step of obtaining the start word line addresses and the corresponding stop word line addresses comprises:
   the dynamic random access memory unit automatically detecting the memory cells stored with data, so as to obtain and store the start word line addresses and the stop word line addresses.

* * * * *